United States Patent
Hollis

(10) Patent No.: US 9,148,170 B2
(45) Date of Patent: Sep. 29, 2015

(54) METHODS AND APPARATUSES FOR LOW-POWER MULTI-LEVEL ENCODED SIGNALS

(71) Applicant: MICRON TECHNOLOGY, INC., Boise, ID (US)

(72) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/506,902

(22) Filed: Oct. 6, 2014

(65) Prior Publication Data
US 2015/0022383 A1 Jan. 22, 2015

Related U.S. Application Data

(63) Continuation of application No. 13/475,728, filed on May 18, 2012, now Pat. No. 8,854,236.

(51) Int. Cl.
*H03M 5/20* (2006.01)
*G06F 13/42* (2006.01)
*H03M 5/02* (2006.01)

(52) U.S. Cl.
CPC *H03M 5/20* (2013.01); *H03M 5/02* (2013.01); *G06F 13/42* (2013.01)

(58) Field of Classification Search
CPC .......... H03M 5/14; H03M 5/16; H03M 5/20; G06F 13/42
See application file for complete search history.

(56) References Cited

U.S. PATENT DOCUMENTS

| | | | |
|---|---|---|---|
| 5,331,320 | A | 7/1994 | Cideciyan et al. |
| 6,032,248 | A | 2/2000 | Curry et al. |
| 6,518,893 | B1 | 2/2003 | Robinson |
| 6,741,190 | B2 | 5/2004 | Henkel et al. |
| 6,844,833 | B2 | 1/2005 | Cornelious et al. |
| 7,113,550 | B2 | 9/2006 | Stonecypher et al. |
| 8,014,196 | B2 | 9/2011 | Graef |
| 8,026,740 | B2 | 9/2011 | Hollis |
| 8,762,813 | B2 | 6/2014 | Tang et al. |
| 2004/0135709 | A1 | 7/2004 | Cornelius et al. |
| 2007/0096950 | A1 | 5/2007 | Yang et al. |
| 2009/0190690 | A1 | 7/2009 | Kuwata |

(Continued)

FOREIGN PATENT DOCUMENTS

JP 11-283396 10/1999

OTHER PUBLICATIONS

Youngsoo Shin et al. Partial Bus-Invert Coding for Power Optimization of Application-Specific Systems, IEEE Transactions on Very Large Scale Integration (VLSI) Systems, vol. 9, No. 2, Apr. 2001.*
International Search Report and Written Opinion, mailed Aug. 26, 2013 for Appl No. PCT/US2013/041575.
Hollis, "Data Bus Inversion in High-Speed Memory Applications", IEEE Transactions on Circuits and Systems—II Express Briefs, vol. 56, No. 4, Apr. 2009, 300-304.

(Continued)

*Primary Examiner* — Howard Williams
(74) *Attorney, Agent, or Firm* — Dorsey & Whitney LLP

(57) ABSTRACT

Methods and apparatuses for providing multi-level encoded signals are disclosed. An apparatus may include an encoding circuit and a multi-level encoder. The encoding circuit may be configured to receive data and provide encoded data based, at least in part on the data. The multi-level encoder may be coupled to the encoding circuit and configured to receive the encoded data. The multi-level encoder may be further configured to provide the encoded data to a bus as multi-level signal responsive, at least in part, to receipt of the encoded data.

20 Claims, 5 Drawing Sheets

(56) References Cited

U.S. PATENT DOCUMENTS

| | | |
|---|---|---|
| 2009/0238300 A1 | 9/2009 | Hollis |
| 2009/0313521 A1 | 12/2009 | Hollis |
| 2010/0026533 A1 | 2/2010 | Hollis |
| 2011/0018517 A1 | 1/2011 | Candage et al. |
| 2011/0316726 A1 | 12/2011 | Hollis |
| 2013/0307708 A1 | 11/2013 | Hollis |

OTHER PUBLICATIONS

Rokhami, et al., "Low-Power Bus Transform Coding for Multilevel Signals", IEEE Asia Pacific Conference on Circuits and Systems, Dec. 2006, 1272-1275.

Stan, et al., "Bus-Invert Coding for Low-Power I/O", IEEE Transactions on Very Large Scale Integration, vol. 3, No. 1, Mar. 1995, 49-58.

First office action dated Jun. 10, 2015 received for TW appln No. 102117626.

\* cited by examiner

METHODS AND APPARATUSES FOR LOW-POWER MULTI-LEVEL ENCODED SIGNALS

CROSS REFERENCE TO RELATED APPLICATION(S)

This application is a continuation of U.S. patent application Ser. No. 13/475,728, filed May 18, 2012, which application is incorporated herein by reference, in its entirety, for any purpose.

TECHNICAL FIELD

Embodiments of the present invention relate generally to memories, and more particularly, in one or more of the illustrated embodiments, to encoded multi-level signals, for example, in memory systems.

BACKGROUND OF THE INVENTION

In a typical integrated system, such as a memory system, data is transferred between devices based on one or more clock signals provided to (e.g. applied to and/or generated by) the integrated system. In particular, data must be provided to devices at proper times relative to rising and/or falling edges of clock signals to ensure that a device properly captures data. In more modern systems, clock speeds have continued to increase. As a result, the duration that data placed on a bus may be considered valid has decreased. Moreover, due to disparities in performance between memory and logic transistors, scaling bandwidth between chips to desired levels has become an increasingly difficult task.

One approach that has been used to address increasing clock speeds has been the use of multi-level signaling. In multi-level signaling a single signal may be used to represent multiple bits of data, and as a result, clock speeds over particular busses may be decreased without decreasing bandwidth, or alternatively, bandwidth can be increased without increasing clock speed. That is, in systems utilizing multi-level signaling, multi-level drivers provide multi-level signals over busses having a voltage that corresponds to one of $2^X$ (X>1) particular levels at rising and/or falling edges of clock signals, with each of the levels representing multiple bits of data. As a result, data throughput for a given frequency may be increased by a factor of X or bandwidth may be maintained using a lower frequency.

However, utilizing multi-level signaling in memory systems is not without its drawbacks, as using multi-level signals can consume more power in comparison to systems that do not use multi-level signals. Moreover, because power consumed in multi-level signaling is dependent on patterns of data provided by multi-level drivers, some patterns of data can result in higher power consumption than for other patterns of data.

DETAILED DESCRIPTION

Methods and apparatuses for providing multi-level encoded signals are disclosed. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
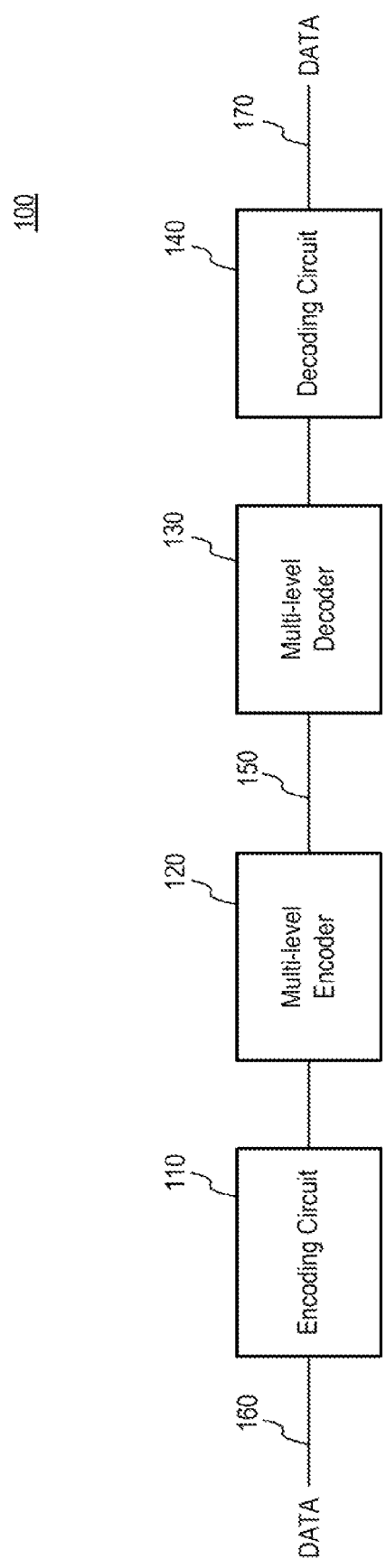
FIG. 1 is a block diagram of an apparatus according to an embodiment of the invention.

FIG. 1 illustrates an apparatus 100 according to an embodiment of the invention. The apparatus 100 may include an encoding circuit 110, a multi-level encoder 120, a multi-level decoder 130, and a decoding circuit 140. The multi-level encoder 120 may be coupled to the encoding circuit 110 and may further be coupled to the multi-level decoder 130 by a bus 150. The multi-level decoder 130 may further be coupled to the decoding circuit 140. The encoding circuit 110 and the decoding circuit 140 may be coupled to busses 160 and 170, respectively. In some embodiments the decoding circuit 140 may be included in a different device than the encoding circuit 110. In such embodiments the bus 150 may be used to transfer data between the different devices. In other embodiments, the decoding circuit 140 and encoding circuit 110 are included in the same device. The busses 150, 160, 170 may comprise any width and may comprise same widths or different widths.

The encoding circuit 110 may comprise one or more encoders (not shown), and may be configured to encode data responsive, at least in part, to receipt of data from the bus 160 and/or one or more control signals (not shown). The encoding circuit 110 may be configured to encode one or more sets of data according to one or more encoding algorithms, such algorithms employing data bus inversion (DBI). With DBI, the state of the data to be transmitted may or may not be inverted prior to transmission according with an encoding algorithm. Examples of encoding algorithms include limited-weight and bus inversion encoding (DBI-DC and DBI-AC, respectively). With DBI-DC encoding the current state of data to be transmitted is considered and the data is inverted or not inverted in order to minimize either the number of "ones" or "zeros" simultaneously transmitted. With DBI-AC encoding the current state of the parallel data is compared with the state of the immediately preceding data and the data is inverted or not inverted to minimize the number of simultaneously transitioning signals of the data. Any combination or sub-combination of DBI-DC and DBI-AC may be used as well.

Employing an encoding algorithm, for example, such as DBI, may reduce power consumption during operation of the apparatus 100. That is, encoding may be used to reduce the current consumed during transitions in data signals from one data to the next, and consequently, reduce overall power consumption.

The multi-level encoder 120 may comprise one or more drivers (not shown in FIG. 1) and/or multi-level drivers (not shown in FIG. 1) and may be configured to provide (e.g., drive) data to a bus, such as the bus 150. The drivers may be conventional drivers as known in the art and will not be further described in the interest of brevity. The multi-level drivers may comprise a multi-level driver known currently or in the future by those having skill in the art, and may each be configured to provide a multi-level signal onto a bus.

A multi-level signal may be a signal having one of any number of particular levels, each level corresponding to a voltage of the signal and representing multiple bits of data. In a four level signaling scheme, for instance, a multi-level signal may comprise one of 4 particular levels, with each of the 4 levels representing two bits of data, such as binary values of "00", "01", "10", or "11". The level a multi-level signal may be based, at least in part, on the voltage of the signal. As an example, a first level corresponding to a highest particular voltage may represent "11" data, a second level corresponding to a second highest particular voltage may represent "10" data, a third level corresponding to a third highest particular voltage may represent "01" data, and a fourth level corresponding to a lowest particular voltage may represent "00" data. In other embodiments, other translations of multiple bits of data to particular voltage may be used without departing from the scope and spirit of the present invention.

The multi-level decoder 130 may be configured to receive multi-level signals from the bus 150 and provide data to the decoding circuit 140. The decoding circuit 140 may be configured to provide decoded data to a bus, such as the bus 170, based, at least in part, on data received from the multi-level decoder 130. The decoded data may, in at least one embodiment, be substantially the same as data provided to the encoding circuit 110.

In an example operation of the apparatus 100, data may be provided to the bus 160 and received by the encoding circuit 110. The encoding circuit 110 may encode the data by employing one or more encoding methods (e.g., one or more DBI encoding algorithms), and the encoded data may be provided to the multi-level encoder 120. The multi-level encoder 120 may provide the encoded data to the multi-level decoder 130 over the bus 150 as one or more multi-level signals. Responsive, at least in part, to receipt of the multi-level signals, the multi-level decoder 130 may decode the multi-level data to provide the encoded data to the decoding circuit 140, which may in turn decode the encoded data to provide decoded data to the bus 170. As described, the decoded data may be substantially the same as the data provided to the bus 160, and in at least one embodiment, the decoding circuit 140 may be configured to decode the data based, at least in part, on one or more control signals.

That is, in addition to providing the encoded data, for instance, with DBI, the encoding circuit 110 may provide one or more DBI control signals. As known, a DBI control signal may indicate the manner in which data is encoded. For example, the DBI control signal may indicate if one or more of the bits of data has been inverted or not inverted. As will be explained in more detail below, data may be provided to the encoding circuit 110, and the encoding circuit 110 may provide both encoded data and one or more DBI control signals to the multi-level encoder 120. The multi-level encoder 120 may provide the encoded data as one or more multi-level signals as described above, and may further provide the one or more DBI control signals as a control signal and/or a multi-level signal. The multi-level decoder 130 may receive the signals and provide the encoded data and the one or more DBI control signals. The decoding circuit 140 may decode the encoded data based, at least in part, on the one or more DBI control signals to provide decoded data.

Figure 2:
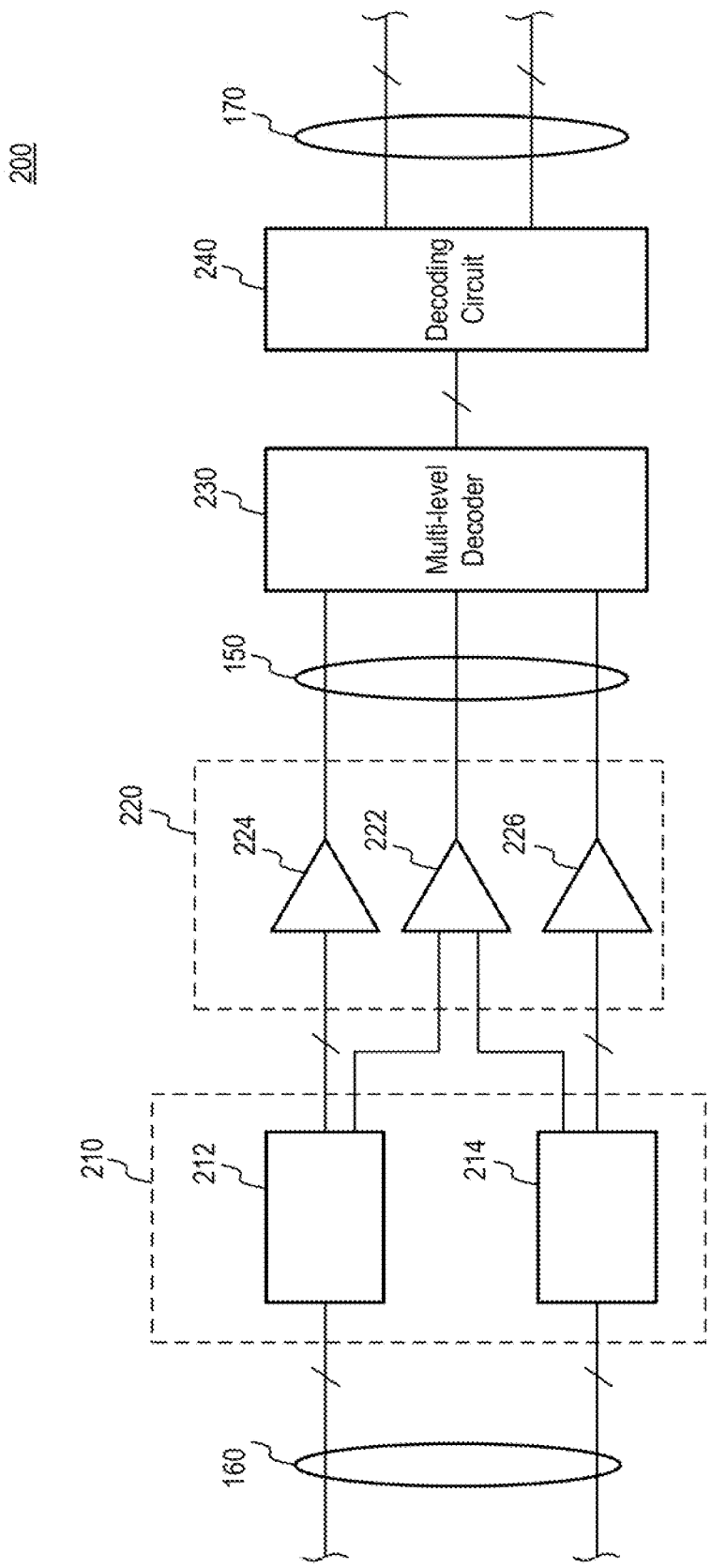
FIG. 2 is a block diagram of an apparatus according to an embodiment of the invention.

FIG. 2 illustrates an apparatus 200 according to an embodiment of the invention. The apparatus 200 includes elements that have been previously described with respect to the apparatus 100 of FIG. 1. Those elements have been identified in FIG. 2 using the same reference numbers used in FIG. 1 and operation of the common elements is as previously described. Consequently, a detailed description of the operation of these elements will not be repeated in the interest of brevity.

The apparatus 200 may include an encoding circuit 210 and a multi-level encoder 220 that may be similar to the encoding circuit 110 and multi-level encoder 120 of FIG. 1, respectively. The encoding circuit 210 may be coupled to the bus 160 and may comprise encoders 212, 214 that may each be configured to receive a respective set of data. The multi-level encoder 220 may be coupled to the encoding circuit 210 and may comprise multi-level drivers 222, 224, and 226. In particular, the multi-level driver 222 may be coupled to each of the encoders 212, 214, and the multi-level drivers 224, 226 may be coupled to the encoders 212, 214, respectively. Each of the multi-level drivers 222, 224, 226 may further be coupled to the bus 150. A multi-level decoder 230 may be included in the apparatus 200 and may be similar to the multi-level decoder 130 of FIG. 1. The multi-level decoder 230 may be coupled to the bus 150 and configured to receive multi-level signals from the multi-level encoder 220 over the bus 150. A decoding circuit 240 may also be coupled to the multi-level encoder 230 and may further be coupled to the bus 170. The decoding circuit 240 may be similar to the decoding circuit 140 of FIG. 1.

In an example operation of the apparatus 200, data may be provided to the bus 160 and received by the encoding circuit 210. As previously described, using one or more encoding algorithms, the encoding circuit 210 may encode the data and provide encoded data and/or a DBI control signal to the multi-level encoder 220. In at least one embodiment, respective sets of the data, such as a first set and a second set, may be encoded by encoders 212, 214, respectively. The first set of data, for example, may comprise any number of the most significant bit(s) of the data provided to the bus 160 and the second set of data may comprise any number of the least significant bit(s) of the data provided to the bus 160. The encoder 212 may provide a first encoded set of data to the multi-level driver 224 and the encoder 214 may provide a second set of encoded data to the multi-level driver 226. The encoders 212, 214 may also provide respective DBI control signals to the multi-level driver 222, and each DBI control signal may be based, at least in part, on the encoding of the first and second sets of data.

The multi-level driver 222 may provide one or more multi-level signals to the bus 150 based, least in part, on the DBI control signals, and the multi-level drivers 224, 226 may provide respective multi-level signals to the bus 150 based, at least in part, on the encoded sets of data. As a result, both the encoded data and the DBI control signals may be provided as multi-level signals. The multi-level decoder 230 may receive the multi-level signals and in response provide the encoded data and DBI control signals to the decoding circuit 240. In turn, the decoding circuit 240 may decode the encoded data based, at least in part, on the DBI control signals and provide decoded data to the bus 170 as previously described.

While the encoding circuit 210 comprises encoders 212, 214, as illustrated in FIG. 2, in other embodiments, the encoding circuit 210 may comprise any number of encoders (not shown) that may each be configured to encode respective sets of data received from the bus 160. Moreover, each of these encoders may be coupled to one or more respective multi-level drivers (not shown) such that each respective set of encoded data may be provided as one or more multi-level signals over the bus 150. In some embodiments, each encoder may correspond to multiple multi-level drivers, allowing for an encoded set of data to be provided as multiple multi-level signals. As an example, the encoding circuit 210 may comprise three encoders, each of which is configured to encode one of three respective sets of data provided to the bus 160 and provide an encoded set of data to corresponding multi-level drivers in the multi-level encoder 220. Each encoder (e.g., encoder 212) may correspond, for instance, to two multi-level drivers such that each set of encoded data is provided as two multi-level signals. In yet another embodiment, multi-level drivers may be configured to provide signals over multiple channels. Thus, an encoded set of data may, for example, be provided as two or more multi-level signals by a single multi-level driver.

Figure 3:
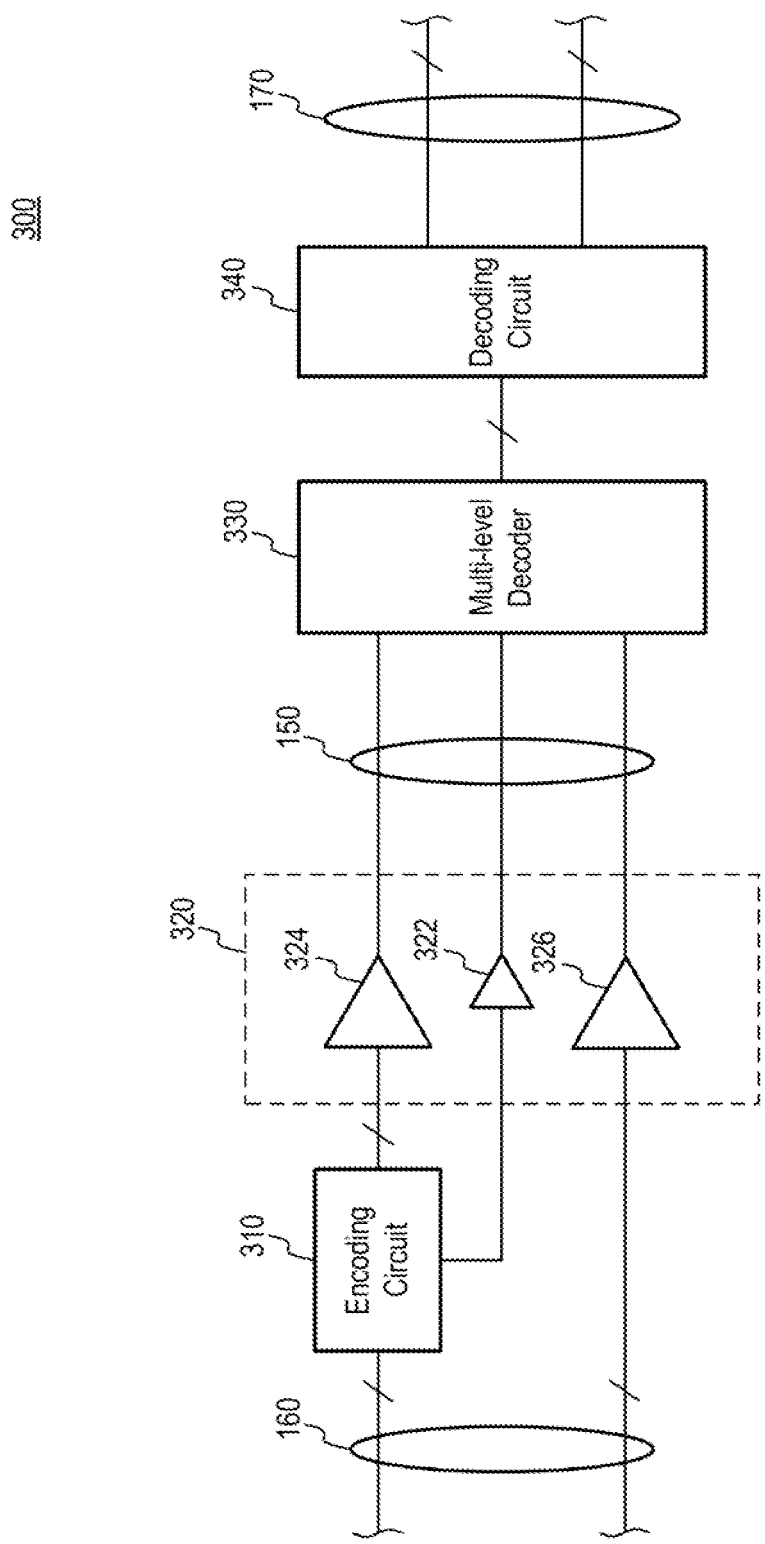
FIG. 3 is a block diagram of an apparatus according to an embodiment of the invention.

In some cases, it may be desirable to encode only a portion of data provided to the bus 160. FIG. 3 illustrates an apparatus 300 in accordance with one or more embodiments of the invention. The apparatus 300 includes elements that have been previously described with respect to the apparatus 100 of FIG. 1. Those elements have been identified in FIG. 3 using the same reference numbers used in FIG. 1 and operation of the common elements is as previously described. Consequently, a detailed description of the operation of these elements will not be repeated in the interest of brevity.

The apparatus 300 may include an encoding circuit 310, multi-level encoder 320, multi-level decoder 330, and decoding circuit 340. The encoding circuit 310 may be coupled to the bus 160 and may be configured to receive a first set of data provided to the bus 160. The multi-level encoder 320 may comprise a driver 322 and multi-level drivers 324, 326. The driver 322 and the multi-level driver 324 may be coupled to the encoding circuit 310 and may further be coupled to the multi-level decoder 330 by the bus 150. The multi-level driver 326 may be coupled to the bus 160 and configured to receive a second set of data and may also be coupled to the multi-level decoder 330. The multi-level decoder 330 may be configured to provide the first and second sets of encoded data responsive, at least in part, to receipt of multi-level signals from the bus 150. The decoding circuit 340 may be coupled to the bus 170 and may provide decoded data based, at least in part, on the first and second sets of encoded data and/or one or more DBI control signals.

In an example operation of the apparatus 300, data may be provided to the bus 160. The encoding circuit 310 may receive a first set of the data, and responsive, at least in part, to receipt of the first set of data, may encode the first set of data using one or more encoding algorithms. As previously described, the encoding circuit 310 may also provide a DBI control signal, for instance, to the driver 322 of the multi-level encoder 320. The multi-level driver 324 may receive the encoded first set of data from the encoding circuit 110 and the multi-level driver 326 may receive the second set of data. In one embodiment, for example, the first set of data may comprise any number of the most significant bit(s) of the data provided to the bus 160 and the second set of data may comprise any number of the least significant bit(s) of the data provided to the bus 160. The multi-level drivers 324, 326 may each provide a multi-level signal based, at least in part, on the encoded first set of data and the second set of data, respectively. Additionally, the driver 322 may provide the DBI control signal to the multi-level decoder 330 over the bus 150. The multi-level decoder 330 may receive the multi-level signals and DBI control signal and provide the encoded first set of data, second set of data, and DBI control signal to the decoding circuit 340. In another embodiment, the driver 322 may provide the DBI control signal to the decoding circuit 340. Based, at least in part, on the DBI control signal, the decoding circuit 340 may decode the encoded data and provide decoded data and/or the second set of data to the bus 170.

In a conventional multi-level signaling scheme, for instance a 4-level signaling scheme, each of the levels corresponds to a respective one of a number of particular voltages and may each represent a distinct binary value. For example, as described above, a first level may correspond to a highest voltage and represent a binary value of "11", a second level may correspond to a second highest voltage and represent "10" data, a third level may correspond to a third highest voltage and may represent "01" data, and a fourth level may correspond to a lowest voltage and may represent "00" data. One approach to providing various voltages in a multi-level signaling scheme may be to sink a particular amount of current from a bus with a multi-level driver. For instance, in an embodiment employing an inverse relationship between binary values and current, a multi-level driver may transmit "11" data over a bus by sinking no current, may transmit "10" data over a bus by sinking a first amount of current, may transmit "01" data by sinking a second amount of current, and may transmit "00" data by sinking a third amount of current.

Figure 4:
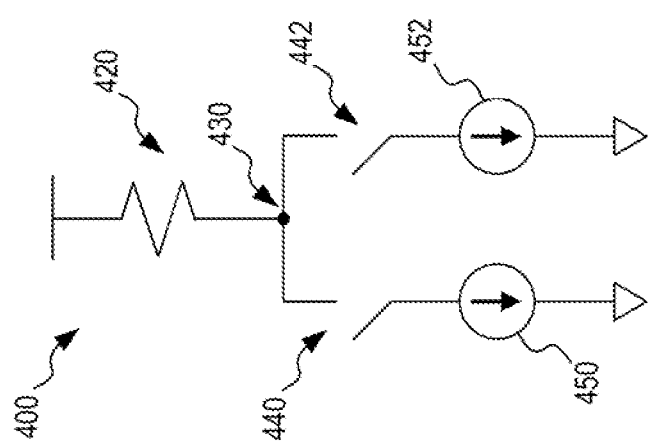
FIG. 4 is a schematic diagram of a driver that may be used in the apparatus of FIG. 1 according to an embodiment of the invention.

In accordance with an embodiment of the invention, FIG. 4 illustrates a multi-level driver 400 that may be used in the multi-level encoder 120 of FIG. 1. The multi-level driver 400 may include a resistance 420 that may be coupled between a supply voltage (e.g., VCC) and a node 430, and may further include switches 440 and 442 coupled between the node 430 and respective current sources 450, 452. The switches 440, 442 may comprise transistors (e.g., field effect transistor or bipolar junction transistor), such as p-channel field effect transistors (pFETs), or may be any other type of switch known in the art. The current sources 450, 452 may be coupled to a reference voltage (e.g., VSS), and may be configured to sink respective amounts of current. The current sources 450, 452 may comprise passive current sources, such as series coupled resistances and voltage sources, and/or active current sources, such as zener diode current sources. It will be appreciated by those having ordinary skill in the art that various implementations, such as operational amplifier current sources or voltage regulator current sources, may also be used without departing from the scope of the present invention.

The current sources 450, 452 may be configured such that they are binary weighted and may be selectively coupled to the node 430 through respective switches 440, 452. This may allow the multi-level driver 400 to linearly increase the amount of current the multi-level driver 400 sinks. For example, in one embodiment, current source 450 may be configured to sink a current having a magnitude of X and current source 452 may be configured to sink a current having a magnitude of 2×. Thus, by selectively controlling the switches 440, 442, the multi-level driver 400 may sink a current having a magnitude of 0×, 1×, 2×, or 3×. The switches 440, 442 may be configured to couple respective current sources 450, 452 to the node 430 in response to receipt of respective control signals (not shown in FIG. 4). The signals may be, for example, respective bits of data provided to the multi-level driver 400.

As an example, with reference to FIGS. 1 and 4, data may be received by the encoding circuit 110 and encoded as described above. The encoded data may be provided to a multi-level driver of the multi-level encoder 120 that may comprise the multi-level driver 400 of FIG. 4. Based, at least in part, on the encoded data, the multi-level driver 400 may sink a particular amount of current to drive a multi-level signal onto the bus 150 having a voltage that corresponds to a level representing the received encoded data. If, for instance, the encoded data comprises "10" data, the multi-level driver 400 may couple the current source 450 to the node 430 and sink current having a magnitude of X, thereby providing (e.g. generating) a multi-level signal having the second highest voltage in accordance with the four level signaling scheme previously described.

In some embodiments, the multi-level driver 400 may comprise any number of additional switches that may be coupled between the node 430 and respective current sources. As an example, the multi-level driver 400 may further comprise a switch (not shown) coupled between the node 430 and a current source (not shown) configured to sink a current having a magnitude of 4×. As a result, the multi-level driver 400 may selectively couple current sources to the node 430 to linearly adjust current over a range of 0×-7×, thereby allowing a multi-level signal to have any one of 8 particular voltages and represent 3 bit data. It will be appreciated by those having ordinary skill in the art that additional switches and current sources may be used to increase the number of particular voltages to which levels of a multi-level signal may correspond.

Moreover, in some embodiments, multi-level drivers 400 may be configured to non-linearly adjust current over a range. For example, current source 450 may be configured to sink a current having a magnitude of X and current source 452 may be configured to sink a current having a magnitude of 1.5×, allowing the multi-level driver 400 to sink current having a magnitude of 0×, 1×, 1.5×, or 2.5×. This may allow for a multi-level encoder, such as the multi-level encoder 120 of FIG. 1, to provide voltage levels at any of a number of particular voltage levels that may, for instance, better match characteristics of a multi-level decoder.

Figure 5:
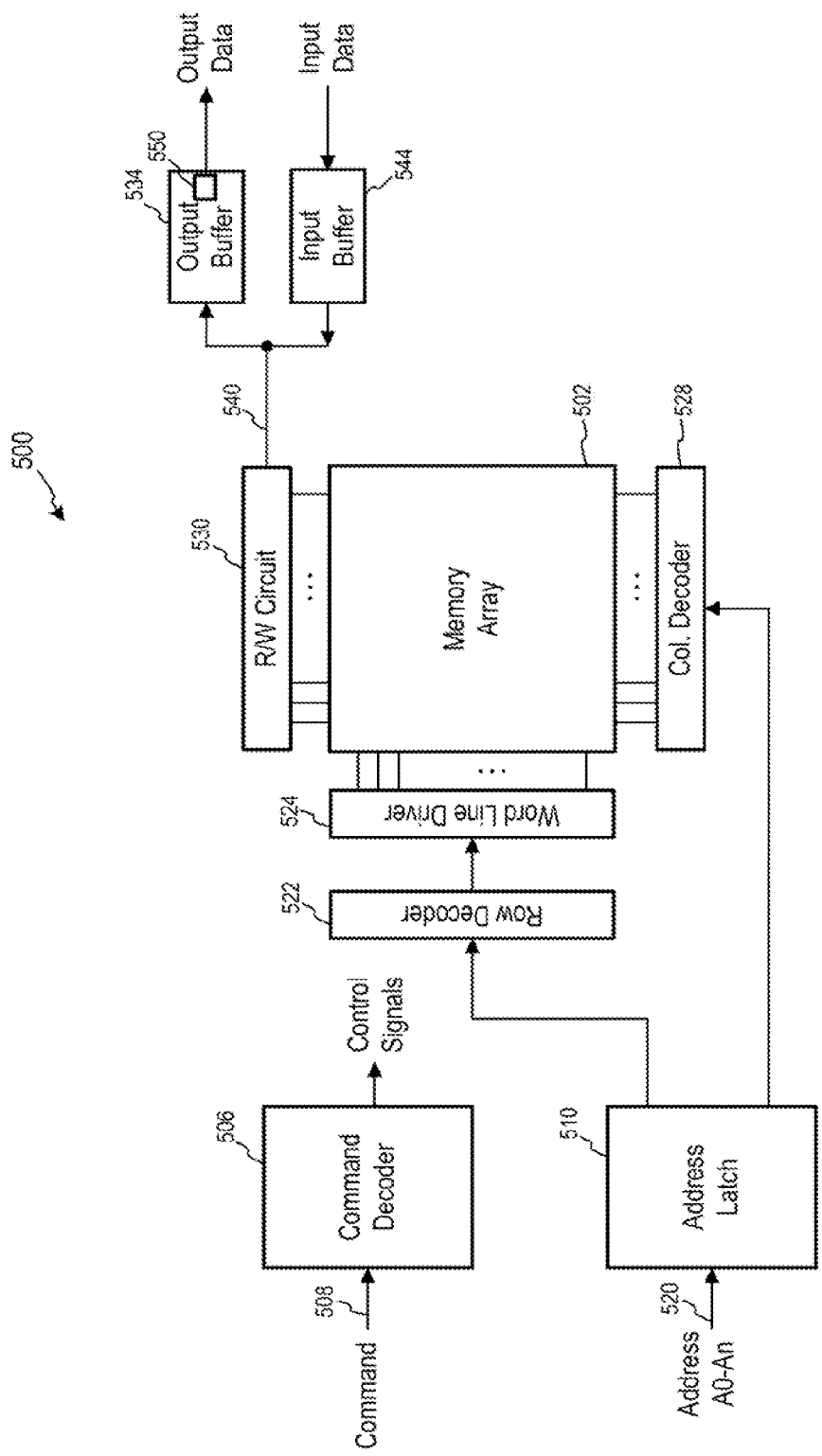
FIG. 5 is a block diagram of a memory that may include the apparatus of FIG. 1 according to an embodiment of the invention.

FIG. 5 illustrates a block diagram of a memory 500 that may include apparatuses, such as the apparatuses 100, 200, and 300, according to an embodiment of the invention. The memory 500 includes an array 502 of memory cells, which may be, for example, DRAM memory cells, SRAM memory cells, flash memory cells, or some other types of memory cells. The memory 500 includes an address/command decoder 506 that receives memory commands and addresses through an ADDR/CMD bus. The address/command decoder 506 provides control signals, based on the commands received through the ADDR/CMD bus. The address/command decoder 506 also provides row and column addresses to the memory 500 through an address bus and an address latch 510. The address latch then outputs separate column addresses and separate row addresses.

The row and column addresses are provided by the address latch 510 to a row address decoder 522 and a column address decoder 528, respectively. The column address decoder 528 selects lines extending through the array 502 corresponding to respective column addresses. The row address decoder 522 is connected to word line driver 524 that activates respective rows of memory cells in the array 502 corresponding to received row addresses. The selected line (e.g., a bit line or bit lines) corresponding to a received column address are coupled to a read/write circuitry 530 to provide read data to a data output circuit 534 via an input-output data bus 540. Write data are provided to the memory array 502 through a data input circuit 544 and the memory array read/write circuitry 530.

At least a portion of the data output circuit 534 may include an apparatus 550 that includes an encoding circuit and multi-level encoder, such as those previously described with reference to the apparatuses 100, 200, and 300, according to an embodiment of the invention. In addition to, or in place of the apparatus 550 of the data output circuit 534, an apparatus 550 may also be included on input-output data bus 540, in between the memory array 502 and the read/write circuitry 530, or in any other location in the memory 500.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a multi-level encoder configured to receive encoded data, unencoded data, and a data bus inversion signal indicative of a manner in which the encoded data is encoded, the multi-level encoder configured to provide a first multi-level signal based on the encoded data, a second multi-level signal based on the unencoded data, and a binary signal based on the data bus inversion signal.

2. The apparatus of claim 1, wherein the encoded data is based on one or more most significant bits of a set of data and wherein the unencoded data comprises one or more least significant bits of the set of data.

3. The apparatus of claim 1, further comprising:
a multi-level decoder configured to receive the first multi-level signal and the binary signal, the multi-level decoder further configured to provide decoded data based on the first multi-level signal and the binary signal.

4. The apparatus of claim 1, wherein the unencoded data is a first set of unencoded data, the apparatus further comprising:
an encoder configured to receive a second set of unencoded data and to encode the second set of unencoded data in accordance with data bus inversion encoding to provide the encoded data and the binary signal.

5. The apparatus of claim 1, wherein the multi-level encoder is configured to provide the first multi-level signal in accordance with a 4-level signaling scheme.

6. The apparatus of claim 1, where the multi-level encoder comprises a plurality of binary weighted current sources.

7. The apparatus of claim 1, wherein the multi-level encoder includes a driver configured to provide the binary signal.

8. An apparatus, comprising:
an encoding circuit configured to receive a first set of data and encode the first set of data to provide an encoded set of data; and
a multi-level encoder, comprising:
a first multi-level driver configured to receive the encoded set of data and provide a first multi-level signal based on the encoded set of data; and
a second multi-level driver configured to receive a second set of data and provide a second multi-level signal based on the second set of data.

9. The apparatus of claim 8, wherein the encoding circuit is further configured to provide a data bus inversion control signal associated with the first set of data.

10. The apparatus of claim 9, further comprising:
a third multi-level driver configured to receive the data bus inversion control signal and provide a third multi-level signal based on the data bus inversion control signal.

11. The apparatus of claim 8, wherein the encoding circuit comprises a plurality of encoders, each of the plurality of encoders configured to encode a respective set of data.

12. The apparatus of claim 8, wherein a magnitude of the first multi-level signal is based on a magnitude of current driven by the first multi-level driver.

13. The apparatus of claim 8, further comprising:
a multi-level decoder configured to receive the first and second multi-level signals to provide the first and second sets of data.

14. A method, comprising:
receiving encoded data, unencoded data, and a data bus inversion signal indicative of the manner in which the encoded data is encoded; and
providing a first multi-level signal based on the encoded data using a first-multi level driver, a second multi-level signal based on the unencoded data using a second multi-level driver, and a control signal based on the data bus inversion signal.

15. The method of claim 14, wherein receiving encoded data, unencoded data, and a data bus inversion control signal indicative of the manner in which the encoded data is encoded comprises:
receiving the encoded data and the data bus inversion control signal from an encoding circuit; and
receiving the unencoded data from a bus.

16. The method of claim 14, further comprising:
receiving, with a decoder, the first multi-level signal and the binary signal; and
decoding, with the decoder, the first multi-level signal and the binary signal to provide the encoded data and the data bus inversion signal.

17. The method of claim 16, further comprising:
decoding the encoded data based on the data bus inversion signal to provide a set of data.

18. The method of claim 14, wherein the encoded data corresponds to one or more most significant bits of data.

19. The method of claim 14, wherein providing a first multi-level signal based on the encoded data using a first-multi level driver, a second multi-level signal based on the unencoded data using a second multi-level driver, and a control signal based on the data bus inversion signal comprises:
providing the control signal as a binary signal using a driver.

20. The method of claim 14, wherein providing a first multi-level signal based on the encoded data using a first-multi level driver, a second multi-level signal based on the unencoded data using a second multi-level driver, and a control signal based on the data bus inversion signal comprises:
sinking current with a first current source of the first multi-level driver to provide the first multi-level signal; and
sinking current with a second current source of the second multi-level driver to provide the second multi-level signal.

* * * * *